(12) United States Patent
Denny et al.

(10) Patent No.: US 6,362,416 B1
(45) Date of Patent: Mar. 26, 2002

(54) ELECTROMAGNETIC COMPATIBILTY (EMC) SHIELD

(75) Inventors: Ian McFarlane Denny, Greenock; Peter Andrew Smith, Skelmorlie; Gavin Wright, Wemyss Bay, all of (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/275,547

(22) Filed: Mar. 23, 1999

(30) Foreign Application Priority Data

Mar. 27, 1998 (GB) ................................................ 9806457

(51) Int. Cl.[7] .................................................. H05K 9/00
(52) U.S. Cl. ............................... 174/35 R; 174/35 GC; 361/816; 361/818; 361/756; 361/727; 361/799; 361/800
(58) Field of Search .......................... 174/35 R, 35 GC; 361/816, 818, 685, 799, 800, 801, 727, 741, 756; 312/223.2

(56) References Cited

U.S. PATENT DOCUMENTS

| 5,305,180 A | * | 4/1994 | Mitchell et al. | ............ | 361/685 |
| 5,557,499 A | * | 9/1996 | Reiter et al. | ................ | 361/685 |
| 5,886,879 A | * | 3/1999 | Matuschik | ................... | 361/818 |
| 5,924,782 A | * | 7/1999 | Park | .......................... | 312/328 |
| 6,008,984 A | * | 12/1999 | Cunningham et al. | ...... | 361/685 |
| 6,011,687 A | * | 1/2000 | Gluskoter et al. | .......... | 361/686 |
| 6,018,456 A | * | 1/2000 | Young et al. | ............... | 361/684 |

* cited by examiner

*Primary Examiner*—Dean A. Reichard
*Assistant Examiner*—W. David Walkenhorst
(74) *Attorney, Agent, or Firm*—Randall J. Bluestone

(57) ABSTRACT

A hot swap tray having a housing adapted to be slidably inserted in a rack. The tray includes an electromagnetic shield member mounted for rotation about an axis traversing the sliding direction of the tray. The shield has a resting state in which the shield presents a first dimension in a plane traversing the sliding direction and a deflected state in which the shield presents a second dimension in the plane, the first dimension being greater than the second dimension. The shield is actuated on insertion of the tray into the rack to move from the resting state to the deflected state so that the shield clears adjacent shields located within the rack and from the deflected state to the resting state so that the shield engages the adjacent shields.

5 Claims, 4 Drawing Sheets

ELECTROMAGNETIC COMPATIBILTY (EMC) SHIELD

BACKGROUND OF THE INVENTION

I. Field of the Invention

The present invention relates to an EMC shield for use, in particular, with a hot swap tray.

II. Background of the Invention

There is a requirement for modern electronic devices to emit as little electromagnetic radiation as possible as well as to be as resistant as possible to external electromagnetic interference or electrostatic discharges when in use. A universal solution is to surround devices with an electrically grounded shield. This is a relatively simple task when designing an individual device to be compatible with modern EMC requirements.

The task becomes more complicated when trying to shield groups of devices and, in particular, disk drives which form part of a disk array located in a rack. This is because each drive needs to have a shield which can link with the shields of adjacent drives to form a continuous shield. The traditional prior art solution, shown schematically in FIG. 1, has been to provide a tray 10, housing the disk drive 11, with a conductive vertically oriented shield 12 disposed between the disk drive housing and a front plate 15. Each tray 10 is inserted into the rack so that the disk drive 11 connects via a suitable plug and socket connector assembly 16 to a backplane 14. When inserted, the trays 10 are vertically spaced apart from one another so that their respective shields 12 are just touching, thus providing a continuous shield towards the front of the disk array. Usually the backplane 14 along with the body of rack acts to complete the electromagnetic enclosure.

The prior art solution requires the shield 12 to be resilient so that, on insertion of a drive, its shield may pass over another shield and flex back into contact with the other shield once the drive is fully accommodated to make an electrical connection and complete the shield. The prior art solution works well when trays are not inserted and removed frequently from the array.

New standards, however, allow trays to be hot swapped, so that they may be inserted and removed when the disk array is operational. Hot swapping is necessary in systems where down time must be avoided and where it is necessary to replace a faulty disk, to upgrade a disk with a faster or larger disk or simply to insert a disk carrying tray instead of a blank tray as storage requirements increase. Thus, trays are removed and inserted into disk arrays much more frequently than prior art solutions are designed to operate with.

It is an object of the present invention to mitigate such problems with shielding disks in a disk array.

SUMMARY OF THE INVENTION

Accordingly, the present invention provides a tray comprising a housing adapted to be slidably inserted in a rack, said tray including an electromagnetic shield member mounted for rotation about an axis traversing the sliding direction of said tray, said shield having a resting state in which said shield presents a first aspect in a plane traversing the sliding direction and a deflected state in which said shield presents a second aspect in said plane, said first aspect being greater than said second aspect, said shield being actuable on insertion of said tray into said rack to move from said resting state to said deflected state so that said shield clears adjacent shields located within the rack and from said deflected state to said resting state so that said shield engages said adjacent shields.

It will be seen that a tray including the shield mechanism according to the invention requires minimum insertion force and is not prone to wear in the manner of prior art solutions.

DESCRIPTION OF THE PREFERRED EMBODIMENTS

Figure 2:
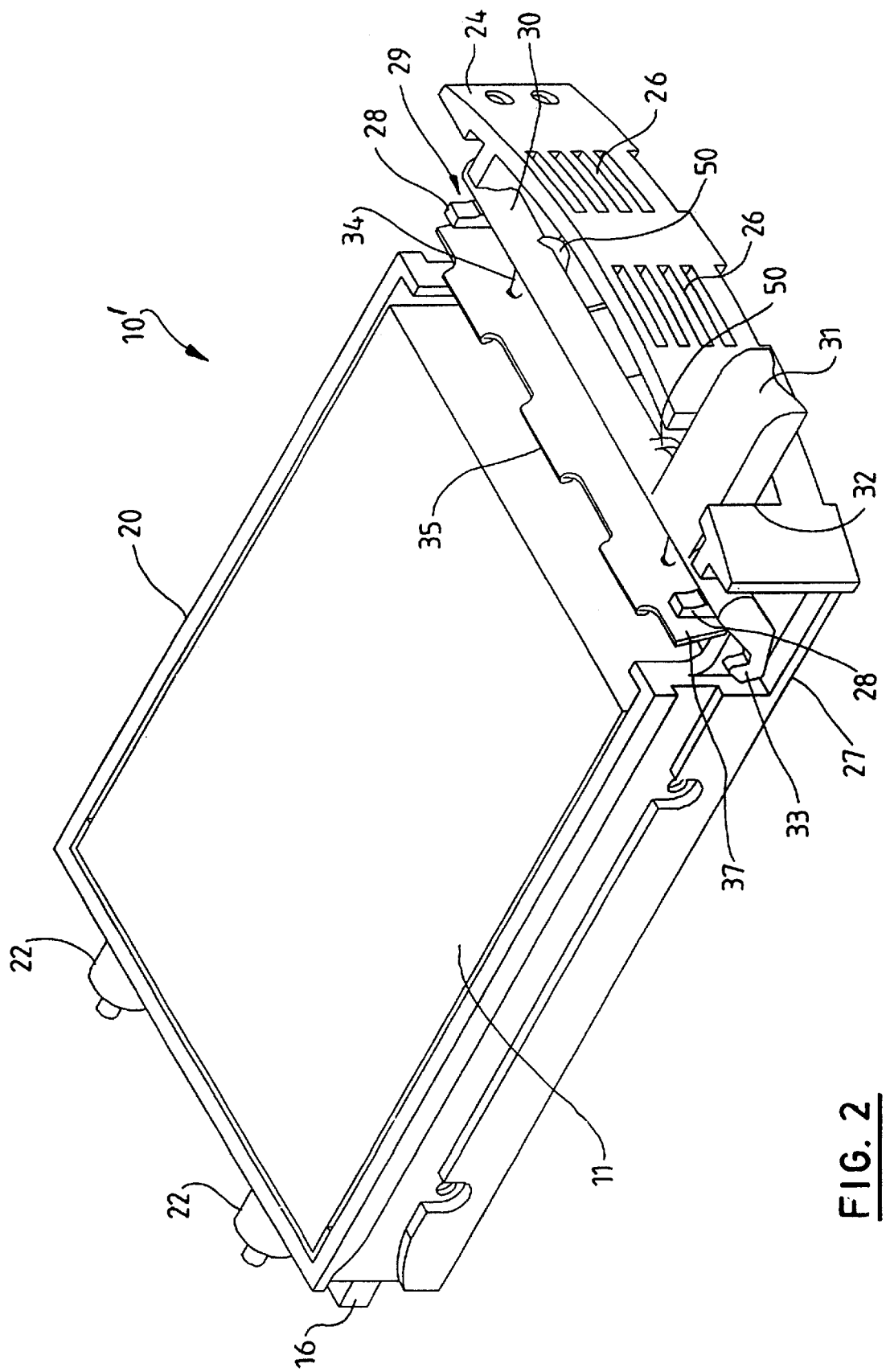
FIG. 2 is perspective view of a tray according to the present invention incorporating a disk drive.

Referring now to FIG. 2, a tray 10' according to the invention comprises a housing in the form of a generally rectangular open topped enclosure 20 for a disk drive 11. A pair of latch spring and piston assemblies 22 are located to the rear of the enclosure 20. When the tray is inserted into a rack, the springs of the assemblies 22 are compressed against the backplane (not shown) and their stored compressed energy is used to release the tray from the rack as will be explained later.

A front plate 24 is spaced apart from the enclosure 20 and connected thereto by a bridge 27 extending horizontally from the bottom of the enclosure. In the present embodiment, the plate 24 curves about vertical axis for aesthetic reasons and is further provided with a plurality of ventilation holes 26.

A pair of supports 28 project from the rear surface adjacent either end of the front plate 24. The supports 28 are formed to include a round bottomed slot 29 into which either end of a latch bar 30 sits. The latch bar 30 includes a handle 31 which projects forwardly of the bar 30 through a front slot 32 formed in the front plate 24 in register with the handle. The latch bar 30 includes two catches 33 projecting rearwardly from either end of the bar and straddling the supports 28 to retain the bar in a stable lateral position. The handle 31 is biased downwards and thus the catches 33 are biased upwards by a coil spring, only the ends 50 of which are shown, located over the bar 31.

Figure 1:
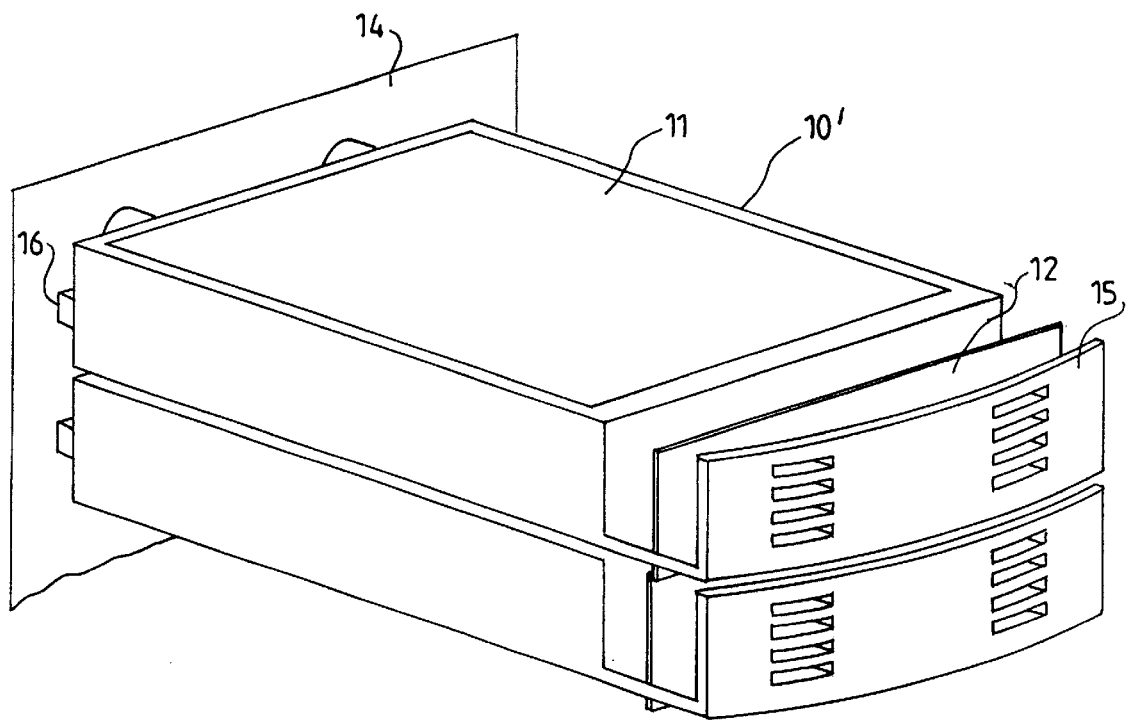
FIG. 1 is a schematic view of a disk array including prior art trays.
Figure 3:
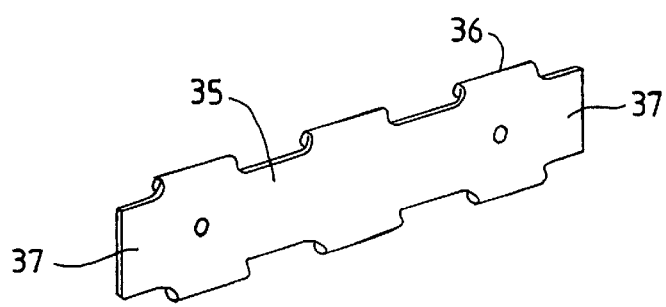
FIG. 3 is a view of a shield incorporated in the tray of FIG. 2.

Inside the supports 28 a pair of posts 34 project rearwardly from the bar 30 in generally the same direction as the catches 33. The top of the posts (not shown) are so shaped, for example, with a mushroom head, to allow a shield plate 35 to snap fit over the posts. FIG. 3 shows the shield plate 35 in more detail. The plate 35, formed from a resilient metal, incorporates a crenellated upper and lower edge. Each edge includes three teeth 36 each having a rolled edge with the teeth of the upper edge being in register with the teeth of the lower edge. This provides multiple points of contact and provides a better chance of contact between adjacent shields than straight edged shields. Each of the sides 37 of the plate project outwardly, so that when in use, the sides lie inside the catches 33.

Figure 4:
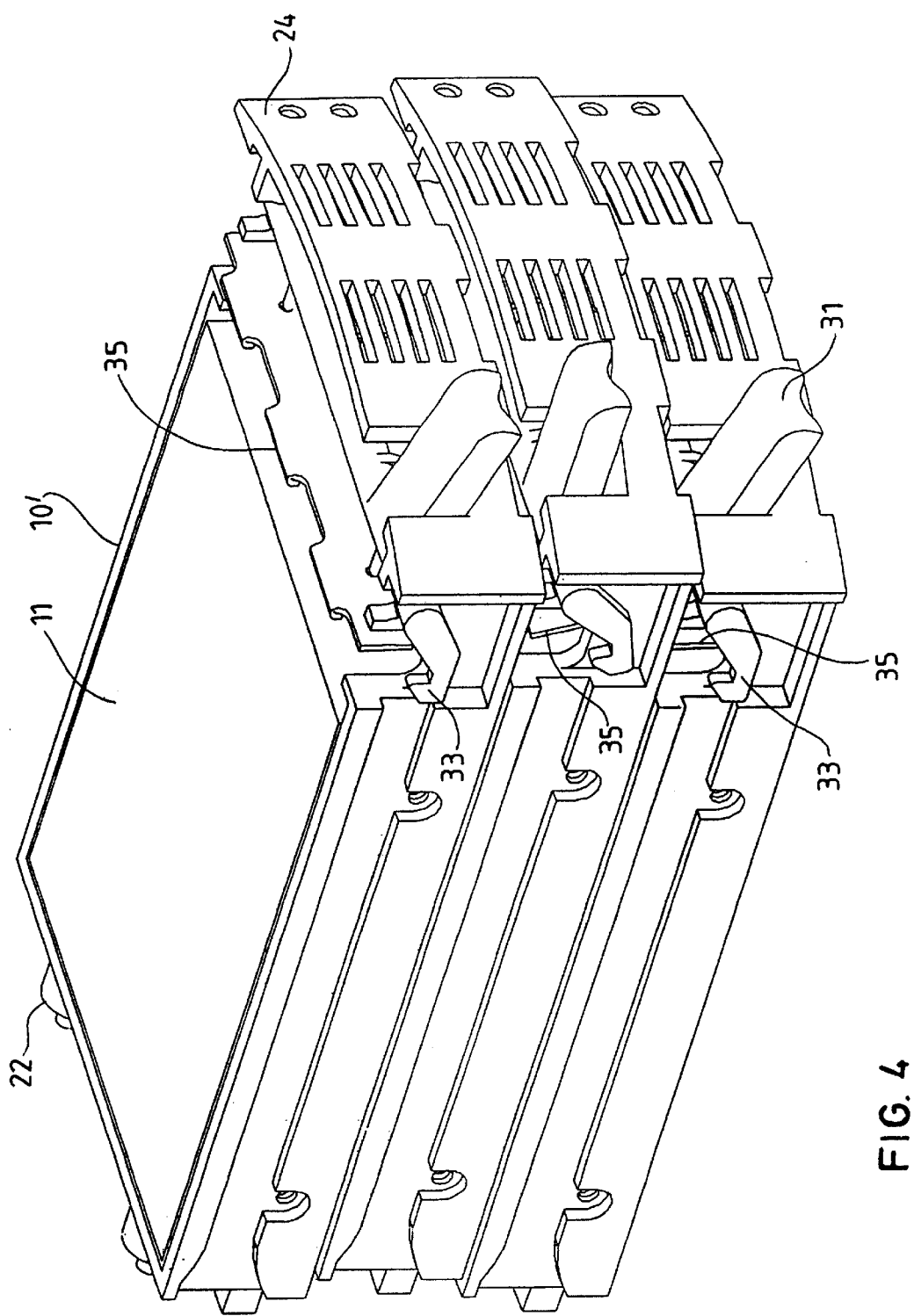
FIG. 4 is a perspective view of a plurality of the trays of FIG. 2 in their use relationship.
Figure 5A:
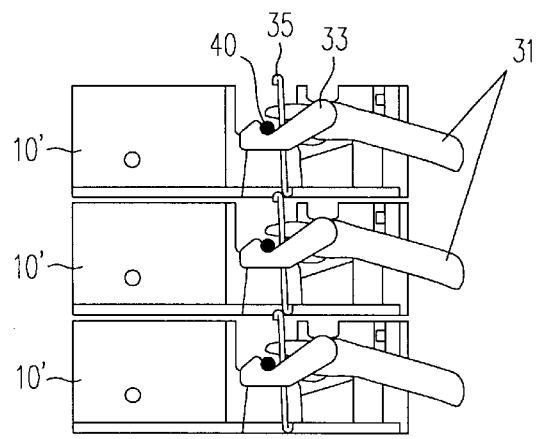
FIG. 5(a) is one of a series of FIGS. 5(a) to 5(f) showing the operation of the tray of FIG. 2.
Figure 5B:
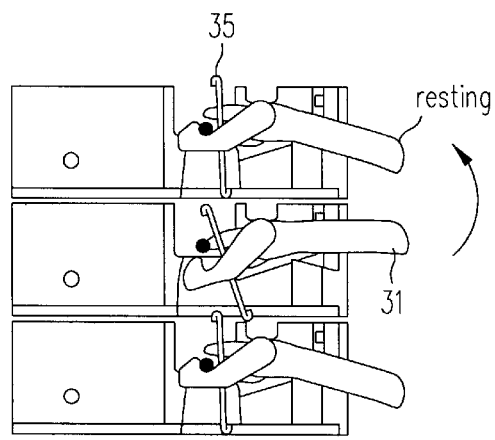
FIG. 5(b) is one of a series of FIGS. 5(a) to 5(f) showing the operation of the tray of FIG. 2.
Figure 5C:
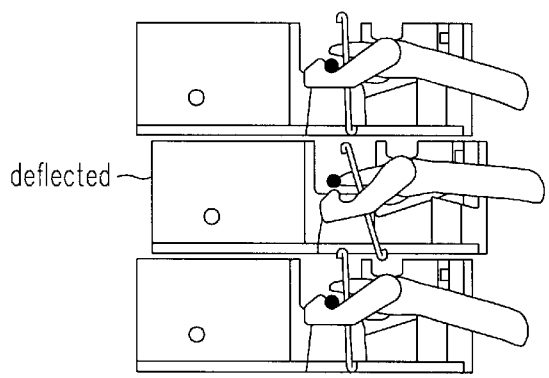
FIG. 5(c) is one of a series of FIGS. 5(a) to 5(f) showing the operation of the tray of FIG. 2.
Figure 5D:
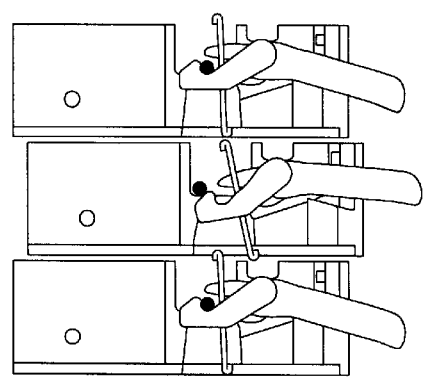
FIG. 5(d) is one of a series of FIGS. 5(a) to 5(f) showing the operation of the tray of FIG. 2.
Figure 5E:
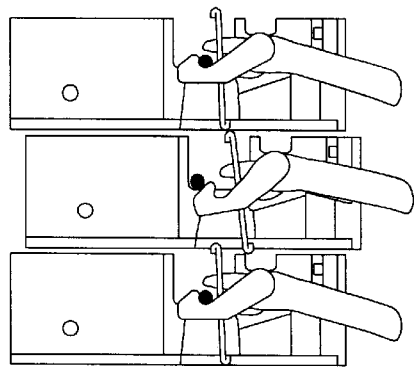
FIG. 5(e) is one of a series of FIGS. 5(a) to 5(f) showing the operation of the tray of FIG. 2.
Figure 5F:
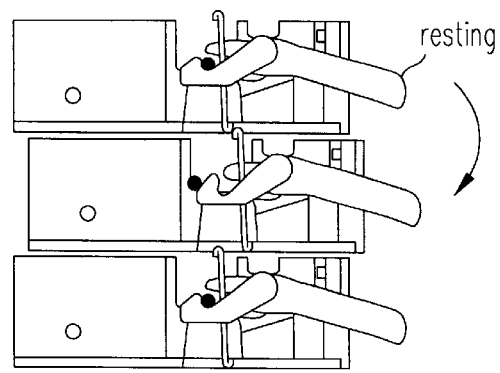
FIG. 5(f) is one of a series of FIGS. 5(a) to 5(f) showing the operation of the tray of FIG. 2.

In use, trays 10', which either include disk drives 11 or are used as blanks to fill empty spaces in the disk array, sit on top of one another in a disk array, FIG. 4. The trays are held in place within the rack using the catches 33 which latch onto respective holding pins 40, FIG. 5, projecting from an inside surface of a side wall of the rack. During insertion and withdrawal from rack the shield 35 lies at an off vertical angle thus reducing its vertical aspect enough to allow it to pass between the drives above and below it.

FIGS. 5(*a*) to 5(*f*) show the operation of the tray according to the invention in more detail. FIG. 5(*a*) shows three trays 10' mounted above one another. As mentioned earlier, on insertion of the trays into the rack, the springs 22 have been compressed between their associated tray and the backplane with the catches 33 engaging the holding pins 40 to hold the trays in position against the force of the springs. In this state, the top edge of each shield lies to the rear of the bottom edge of the shield from the tray above.

In order to remove the tray, in this case the middle tray, an operator lifts the handle 31 so that the bar rotates anticlockwise, as illustrated in FIG. 5(*b*). This causes the catches 33 to rotate below the holding pins 40 and thus allow the springs to expand to push the tray forwards, tending to eject the tray from the rack.

Because the shield 35 is coupled to the bar 30, it also rotates about a horizontal axis, thus reducing its vertical aspect. This reduction in vertical aspect, causes the top edge of the shield to drop below the bottom edge of the shield from the tray above the middle tray. Similarly, the bottom edge of the shield rises slightly enabling it to clear the top of the tray below. The shield 35 can therefore pass the shield above and not interfere with the tray below, to allow the middle tray to slide freely from the rack as shown in the subsequent FIGS. 5(*c*) to 5(*e*).

Finally, FIG. 5(*f*), where the catches 33 have passed the holding pins 40, the handle 31 rotates back to its original position indicating to the operator that the tray is now free to be removed from the rack and replaced with either another tray including a disk drive or a blank tray which on insertion will re-complete the EMC shield for the disk array.

It will be seen that no effort is required by the operator after the handle 31 has been lifted as in FIG. 5(*b*) and up to the point the handle returns to its original state in FIG. 5(*f*). This ensures smooth electrical disconnection of the disk drive from the backplane, and reduces the probability of damage to electrical components.

Conversely, to insert the tray, the sequence of FIGS. 5(*a*) to 5(*f*) is reversed until the shield 35 rotates to make contact with the shields in the tray above and below in FIG. 5(*a*). It will be seen that this rotation can be done not only by utilising the movement of the securing catches 33, but by any other method such as using a stop in the rack to force the shield to rotate.

It will be seen that, on inserting the drive tray and securing it, the shield rotates to contact the trays above and below forming a contiguous EMC shield. The shield provides superior EMC shielding to a hot swap or similar tray that does not increase insertion and removal forces and is less likely to suffer damage or loss of shielding performance than conventional contact shields.

It will also been seen that the invention is not limited to the trays mounted above one another and that the invention can be easily applied to trays mounted side by side.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A tray comprising:

a housing adapted to be slidably inserted in a rack;

an electromagnetic shield member mounted for rotation about an axis traversing the sliding direction of said tray, said shield having a resting state in which said shield presents a first dimension in a plane traversing the sliding direction and a deflected state in which said shield presents a second dimension in said plane, said first dimension being greater than said second dimension, said shield being actuated on insertion of said tray into said rack to move from said resting state to said deflected state so that said shield clears adjacent shields located within the rack and from said deflected state to said resting state so that said shield engages said adjacent shields; and wherein said tray further comprises a front plate spaced apart from said housing, said shield is disposed between said front plate and said housing, and said shield is mounted on an axle, said axle being rotatably mounted to said tray, said axle includes a catch disposed on each end of the axle, said catches being cooperable with respective holding members located in said rack to retain said tray within said rack, said holding members are located so as to engage said catches and to cause said axle to rotate on insertion of said tray into said rack so that said shield moves from said resting state to said deflected state.

2. The tray of claim 1 wherein said housing incorporates a disk drive.

3. The tray of claim 1 wherein said holding members are located so as to disengage said catches on further insertion of said tray into said rack so that said shield moves from said deflected state to said resting state.

4. The tray of claim 1 wherein one or more spring mechanisms are located to the rear of said housing, said spring mechanisms being compressed on insertion of said tray into said rack.

5. The tray of claim 4 wherein said axle includes a handle actuated to disengage said catches from said holding members causing said shield to move from said resting state to said deflected state when said tray is fully inserted in said rack allowing said spring mechanisms to urge said tray out of said rack.

* * * * *